United States Patent
Shen et al.

(10) Patent No.: US 12,235,327 B2
(45) Date of Patent: Feb. 25, 2025

(54) METHOD AND DEVICE FOR CALCULATING STATE OF HEALTH OF BATTERY

(71) Applicant: INDUSTRIAL TECHNOLOGY RESEARCH INSTITUTE, Hsinchu (TW)

(72) Inventors: Yu-Hong Shen, Taichung (TW); Po-Wei Chen, Zhubei (TW); Tsan-Huang Chen, Zhubei (TW)

(73) Assignee: INDUSTRIAL TECHNOLOGY RESEARCH INSTITUTE, Hsinchu (TW)

( * ) Notice: Subject to any disclaimer, the term of this patent is extended or adjusted under 35 U.S.C. 154(b) by 121 days.

(21) Appl. No.: 18/101,970

(22) Filed: Jan. 26, 2023

(65) Prior Publication Data

US 2024/0151779 A1    May 9, 2024

(30) Foreign Application Priority Data

Nov. 4, 2022 (TW) .................................. 111142229

(51) Int. Cl.
G01R 31/392 (2019.01)
G01R 31/3835 (2019.01)
H02J 7/00 (2006.01)

(52) U.S. Cl.
CPC ....... G01R 31/392 (2019.01); G01R 31/3835 (2019.01); H02J 7/005 (2020.01)

(58) Field of Classification Search
None
See application file for complete search history.

(56) References Cited

U.S. PATENT DOCUMENTS

| 10,298,026 B2 | 5/2019 | Trimboli et al. |
| 11,125,822 B2 | 9/2021 | Lucidarme et al. |
| 11,199,894 B2 | 12/2021 | Breen et al. |
| 11,515,713 B2 | 11/2022 | Hale |

(Continued)

FOREIGN PATENT DOCUMENTS

| CN | 102998626 A | 3/2013 |
| CN | 103675702 A | 3/2014 |

(Continued)

OTHER PUBLICATIONS

Taiwan Office Action issued in corresponding application No. 111142229, dated Apr. 25, 2024.

(Continued)

*Primary Examiner* — Jas A Sanghera
(74) *Attorney, Agent, or Firm* — Maschoff Brennan

(57) ABSTRACT

A method for calculating state of health of battery, performed by a processing control circuit, includes: charging a battery under test to an upper voltage with a first constant current through a charging circuit and an electrical measuring circuit, discharging the battery under test to a lower voltage with a second constant current through the charging circuit and the electrical measuring circuit, obtaining an accumulated discharge capacity from the upper voltage to the lower voltage through the electrical measuring circuit, and calculating a state of health of the battery under test at least according to the accumulated discharge capacity and a design capacity.

12 Claims, 5 Drawing Sheets

(56) References Cited

U.S. PATENT DOCUMENTS

| | | | |
|---|---|---|---|
| 2002/0109506 A1 | 8/2002 | Kawakami et al. | |
| 2004/0051534 A1 | 3/2004 | Kobayashi et al. | |
| 2011/0234173 A1* | 9/2011 | Kao .................... | H02J 7/0071 |
| | | | 307/130 |
| 2013/0041606 A1 | 2/2013 | Tang et al. | |
| 2013/0066573 A1 | 3/2013 | Bond et al. | |
| 2014/0009123 A1 | 1/2014 | Park et al. | |
| 2017/0176538 A1 | 6/2017 | Matsumura et al. | |
| 2020/0041576 A1 | 2/2020 | Sato et al. | |
| 2020/0326382 A1* | 10/2020 | Matsumura .......... | G01R 31/371 |
| 2021/0044119 A1 | 2/2021 | Poland et al. | |
| 2021/0190880 A1 | 6/2021 | Hascoat | |
| 2023/0204681 A1 | 6/2023 | Yan et al. | |

FOREIGN PATENT DOCUMENTS

| | | |
|---|---|---|
| CN | 111965546 A | 11/2020 |
| CN | 112172608 A | 1/2021 |
| CN | 111308379 B | 2/2021 |
| CN | 113009366 A | 6/2021 |
| CN | 113296010 A | 8/2021 |
| CN | 114065552 A | 2/2022 |
| CN | 114355224 A | 4/2022 |
| CN | 114706007 A | 7/2022 |
| TW | 201307875 A | 2/2013 |
| TW | 201520572 A | 6/2015 |
| TW | 201709631 A | 3/2017 |
| TW | 201821822 A | 6/2018 |
| TW | 202027360 A | 7/2020 |
| TW | 202124988 A | 7/2021 |
| WO | 2015086754 A1 | 6/2015 |
| WO | 2021/179699 A1 | 9/2021 |

OTHER PUBLICATIONS

Cui et al. "A dynamic spatial-temporal attention based GRU model with healthy features for state-of-health estimation of lithium-ion batteries" IEEE Access ( vol. 9) pp. 27374-27388; Feb. 2021.

Tan et al. "Online state-of-health estimation of lithium-ion battery based on dynamic parameter Identification at multi timescale and support vector regression" Journal of Power Sources 484 (2021) 229233 Nov. 2020.

Che et al. "SOC and SOH identification method of Li-ion battery based on SWPSO-DRNN" IEEE Journal of Emerging and Selected Topics in Power Electronics, vol. 9, No. 4, Aug. 2021.

TW Office Action dated Jul. 20, 2023 as received in Application No. 111142229.

* cited by examiner

METHOD AND DEVICE FOR CALCULATING STATE OF HEALTH OF BATTERY

CROSS-REFERENCE TO RELATED APPLICATIONS

This non-provisional application claims priority under 35 U.S.C. § 119(a) on Patent Application No(s). 111142229 filed in Republic of China on Nov. 4, 2022, the entire contents of which are hereby incorporated by reference.

TECHNICAL FIELD

This disclosure relates to a method and device for calculating state of health of battery.

BACKGROUND

In the era of increasing utilization rates of electric vehicles and electric energy equipment, the recycling of decommissioned batteries is a future trend. Generally speaking, before deploying decommissioned batteries, it is necessary to determine the state of health of the batteries. In the prior art, methods for determining the state of health of a battery include fully charging and discharging method, differential voltage analysis (DVA), incremental capacity analysis (ICA) and internal resistance measurement.

However, the process of charging and discharging the battery is easily affected by external factors, or by aging factors of the battery, resulting in misjudgment of values. In addition, in the methods listed above, multiple complete charging and discharging cycles are required to estimate the state of health, so a large amount of pre-processing is required to establish a database, complex and time-consuming data calculation is required, and updates of various parameters of charging and discharging are limited.

SUMMARY

According to one or more embodiment of this disclosure, a method for calculating state of health of battery, performed by a processing control circuit, includes: charging a battery under test to an upper voltage with a first constant current through a charging circuit and an electrical measuring circuit; discharging the battery under test to a lower voltage with a second constant current through the charging circuit and the electrical measuring circuit; obtaining an accumulated discharge capacity from the upper voltage to the lower voltage through the electrical measuring circuit; and calculating a state of health of the battery under test at least according to the accumulated discharge capacity and a design capacity.

According to one or more embodiment of this disclosure, a device for calculating state of health of battery includes a charging circuit, an electrical measuring circuit, a memory and a processing control circuit. The memory is configured to store an upper voltage, a lower voltage and a design capacity of a battery under test. The processing control circuit is connected to the charging circuit, the electrical measuring circuit and the memory, and is configured to perform: charging the battery under test to the upper voltage with a first constant current through the charging circuit and the electrical measuring circuit; discharging the battery under test to the lower voltage with a second constant current through the charging circuit and the electrical measuring circuit; obtaining an accumulated discharge capacity from the upper voltage to the lower voltage through the electrical measuring circuit; and calculating a state of health of the battery under test at least according to the accumulated discharge capacity and the design capacity.

BRIEF DESCRIPTION OF THE DRAWINGS

The present disclosure will become more fully understood from the detailed description given hereinbelow and the accompanying drawings which are given by way of illustration only and thus are not limitative of the present disclosure and wherein.

DETAILED DESCRIPTION

In the following detailed description, for purposes of explanation, numerous specific details are set forth in order to provide a thorough understanding of the disclosed embodiments. According to the description, claims and the drawings disclosed in the specification, one skilled in the art may easily understand the concepts and features of the present invention. The following embodiments further illustrate various aspects of the present invention, but are not meant to limit the scope of the present invention.

The method and device for calculating state of health of battery according to one or more embodiments of the present disclosure may be used to calculate a state of health of a battery (for example, a decommissioned battery), thereby improving the efficiency of deploying batteries.

Figure 1:
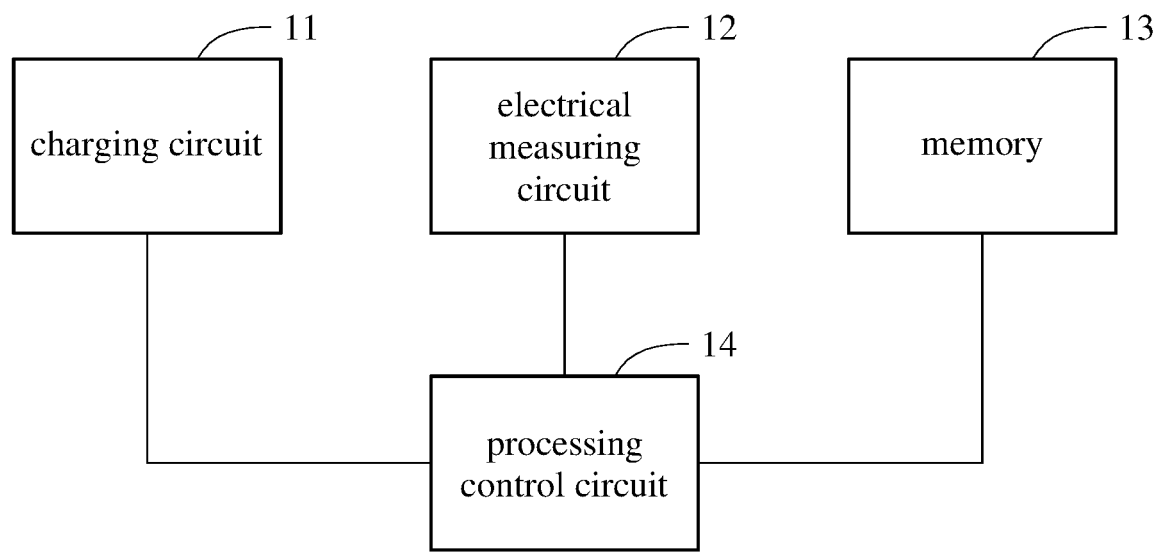
FIG. 1 is a block diagram illustrating a device for calculating state of health of battery according to an embodiment of the present disclosure.

Please refer to FIG. 1, wherein FIG. 1 is a block diagram illustrating a device for calculating state of health of battery according to an embodiment of the present disclosure. As shown in FIG. 1, the device for calculating state of health of battery 1 includes a charging circuit 11, an electrical measuring circuit 12, a memory 13 and a processing control circuit 14. The processing control circuit 14 may be electrically connected to or in communication connection with the charging circuit 11, the electrical measuring circuit 12 and the memory 13. In addition, if the processing control circuit 14 is electrically connected to the charging circuit 11, the electrical measuring circuit 12 and the memory 13, then the charging circuit 11, the electrical measuring circuit 12, the memory 13 and the processing control circuit 14 may be implemented as a battery management chip.

The charging circuit 11 is configured to charge a battery under test. The electrical measuring circuit 12 may be used to measure a voltage of the battery under test, and detect an accumulated discharge capacity of the battery under test etc. For example, the electrical measuring circuit 12 may include a voltage sensor for measuring the voltage of the battery under test. The electrical measuring circuit 12 may further include an analog coulombic integrator configured to detect the accumulated discharge capacity of the battery under test, wherein the analog coulombic integrator may be a hardware element or a software module implemented on a processor of the device for calculating state of health of battery 1.

The memory 13 is preferably a non-volatile memory (NVM), such as a read-only memory (ROM), a programmable read-only memory (PROM), an electrically erasable programmable read-only memory (EAROM), a non-volatile random-access memory (NVRAM) etc. The memory 13 is configured to store an upper voltage, a lower voltage and a design capacity of the battery under test. The upper voltage indicates a condition that the charging circuit 11 is controlled to stop charging. That is, when a voltage level of the battery under test is charged to the upper voltage, the charging circuit 11 is controlled to stop charging the battery under test. The lower voltage indicates a condition that the battery under test stops discharging. That is, when a voltage level of the battery under test is discharged to the lower voltage, the battery under test stops discharging. The design capacity indicates a standard capacity of the battery under test when leaving the factory. In other words, the upper voltage is a highest charge level when charging the battery under test, and the lower voltage is a lowest charge level when discharging the battery under test. The upper voltage and the lower voltage correspond to a common charge level range of the battery under test. Further, the numerical values of the common charge level range depend on usage scenarios of the battery under test, and the upper voltage and the lower voltage may correspond to two boundary values of the common charge level range, respectively. The upper voltage and the lower voltage may be numerical values include +/− errors. In addition, the common charge level range may be associated with usage frequency and/or charging duration etc. of the battery under test. For example, the lower the usage frequency of the battery under test, the corresponding common charge level range may be wider.

The processing control circuit 14 may include but not limited to one processor and an integration of a number of microprocessors (for example, a central processing unit (CPU), a graphics processing unit (GPU) etc.), and one controller and an integration of a number of microcontrollers (for example, a programmable logic controller (PLC)). The processing control circuit 14 may control the status of the charging circuit 11 charging the battery under test, and perform calculation according the measuring result of the electrical measuring circuit 12 and data stored in the memory 13, thereby obtaining the state of health (SOH) of the battery under test.

Figure 2:
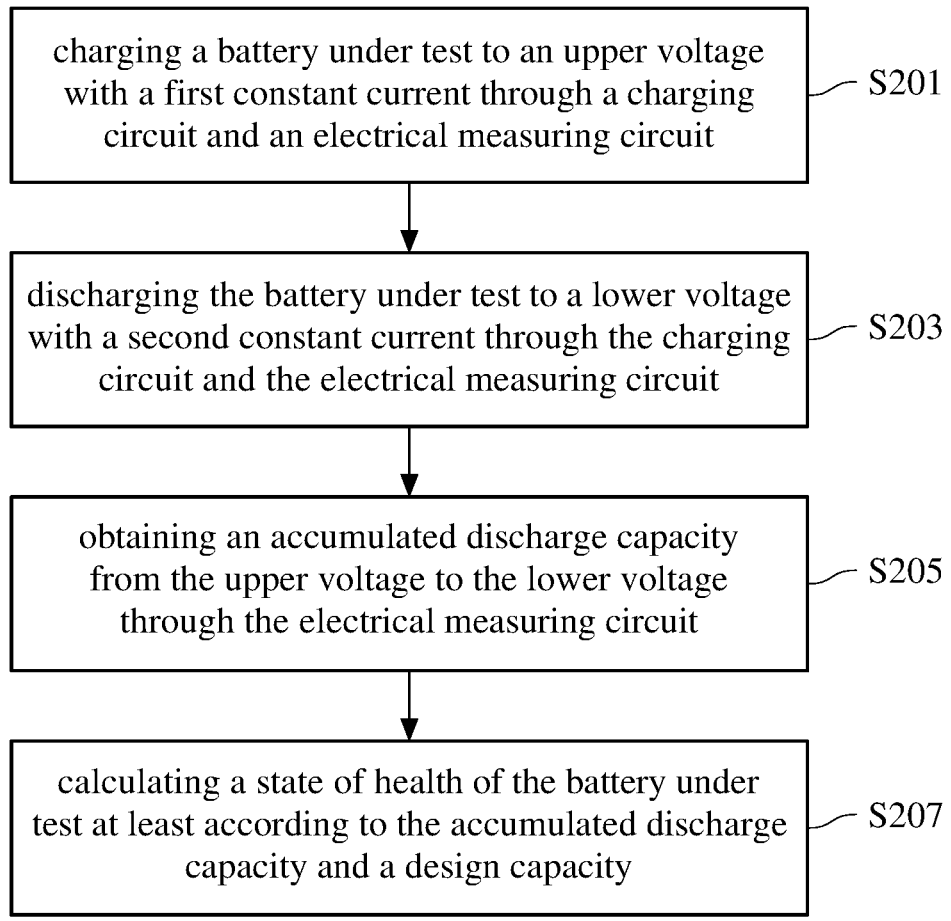
FIG. 2 is a flowchart illustrating a method for calculating state of health of battery according to an embodiment of the present disclosure.

To explain the method and device for calculating state of health of battery according to one or more embodiments of the present disclosure, please refer to FIG. 1 and FIG. 2, wherein FIG. 2 is a flowchart illustrating a method for calculating state of health of battery according to an embodiment of the present disclosure. As shown in FIG. 2, the method for calculating state of health of battery, performed by the processing control circuit 14, includes: step S201: charging a battery under test to an upper voltage with a first constant current through a charging circuit and an electrical measuring circuit; step S203: discharging the battery under test to a lower voltage with a second constant current through the charging circuit and the electrical measuring circuit; step S205: obtaining an accumulated discharge capacity from the upper voltage to the lower voltage through the electrical measuring circuit; and step S207: calculating a state of health of the battery under test at least according to the accumulated discharge capacity and a design capacity.

In step S201, the processing control circuit 14 controls the charging circuit 11 to charge the battery under test with the first constant current, and reads the charge level of the battery under test during charging through the electrical measuring circuit 12, wherein the first constant current is, for example, 25 ampere (A). The electrical measuring circuit 12 may be a voltage sensor. When the processing control circuit 14 determines that the charge level of the battery under test reaches (equal to or larger than) the upper voltage, the processing control circuit 14 controls the charging circuit 11 to stop charging. At this time, the voltage of the battery under test may be equal to the upper voltage.

In step S203, the processing control circuit 14 controls the charging circuit 11 to discharge the battery under test with the second constant current, and reads the charge level of the battery under test during discharging through the electrical measuring circuit 12, wherein the second constant current is, for example, 25 ampere (A). When the processing control circuit 14 determines that the charge level of the battery under test is lowered to the lower voltage, the processing control circuit 14 controls the charging circuit 11 to stop discharging. At this time, the voltage of the battery under test may be equal to the lower voltage.

In step S205, the processing control circuit 14 obtains the accumulated discharge capacity of the battery under test from the upper voltage to the lower voltage through the charging circuit 11, wherein the electrical measuring circuit 12 may be the analog coulombic integrator. In step S207, the processing control circuit 14 reads the design capacity from the memory 13, and calculates the state of health at least according to a ratio of the accumulated discharge capacity and the design capacity. If the ratio according to the accumulated discharge capacity and the design capacity is higher, it means that the current actual capacity and the design capacity of the battery under test are closer to each other, and that the state of health of the battery under test is better.

Through the above embodiment, charging and discharging cycles required for evaluating the state of health of the battery may be reduced, thereby lowering the complexity and time required for evaluating the state of health of the battery.

In addition, before step S201 of FIG. 2, the processing control circuit 14 may be further configured to first control the charging circuit 11 to pre-charge the battery under test to a default initial voltage, wherein the default initial voltage is between the upper voltage and the lower voltage, and the voltage difference between the default initial voltage and the upper voltage is preferably not greater than the voltage difference. Through this embodiment, error of the state of health may be reduced. For example, a default voltage difference is 2V, and assuming that the upper voltage is 52V, then the default initial voltage is preferably around 50V, the present disclosure does not limit the actual numerical value of the default voltage difference.

For example, please refer to table 1 below, wherein table 1 shows the state of health obtained by performing step S201 to S207 described above on the battery under test having different initial voltages, and shows errors between the state of health of the battery under test and the state of health of a control battery. In this example, the first constant current and the second constant current both are 25 A; the battery under test and the control battery both are lithium battery core module, and for the control battery, a standard voltage range is from 32.5V to 54.6V, the design capacity is 28 Ah, and the state of health is 95.2%. Method of obtaining the state of health of the control battery is: discharging the control battery from 54.6V to 32.5V to obtain the accumulated discharge capacity of 27 Ah, and dividing the accumulated discharge capacity by the design capacity to obtain a value as the state of health.

TABLE 1

| initial voltage (V) | initial SOC (%) | upper voltage (V) | SOC after charging (%) | lower voltage (V) | accumulated discharge capacity (Ah) | SOC after discharging (%) | state of health (%) | error (%) |
|---|---|---|---|---|---|---|---|---|
| 42 | 19.5 | 52.05 | 78.6 | 42.07 | 16.5 | 19.7 | 97.3 | 2.2 |
| 46 | 44.3 | 52.02 | 83.1 | 42.07 | 16.6 | 23.7 | 93.4 | −1.9 |
| 50 | 71.1 | 52.10 | 80.6 | 42.07 | 16.3 | 22.3 | 94.8 | −0.1 |

In short, for each initial voltage, the processing control circuit 14 charges the battery under test from the initial voltage to the upper voltage (around 52V), and may record the state of charge (SOC) of the battery under test when the charging is finished; discharges the battery under test from the upper voltage to the lower voltage (around 42.07V) based on the second constant current, and may record the state of charge of the battery under test when the discharging is finished; obtains the accumulated discharge capacity from the upper voltage to the lower voltage of the battery under test; and calculates the state of health of the battery under test at least according to the accumulated discharge capacity and the design capacity. As shown in table 1, when the initial voltage is higher, the smaller the calculated error of the state of health is. In addition, as shown in table 1, the processing control circuit 14 may further record the initial voltage and the corresponding initial state of charge of the battery under test.

Figure 3:
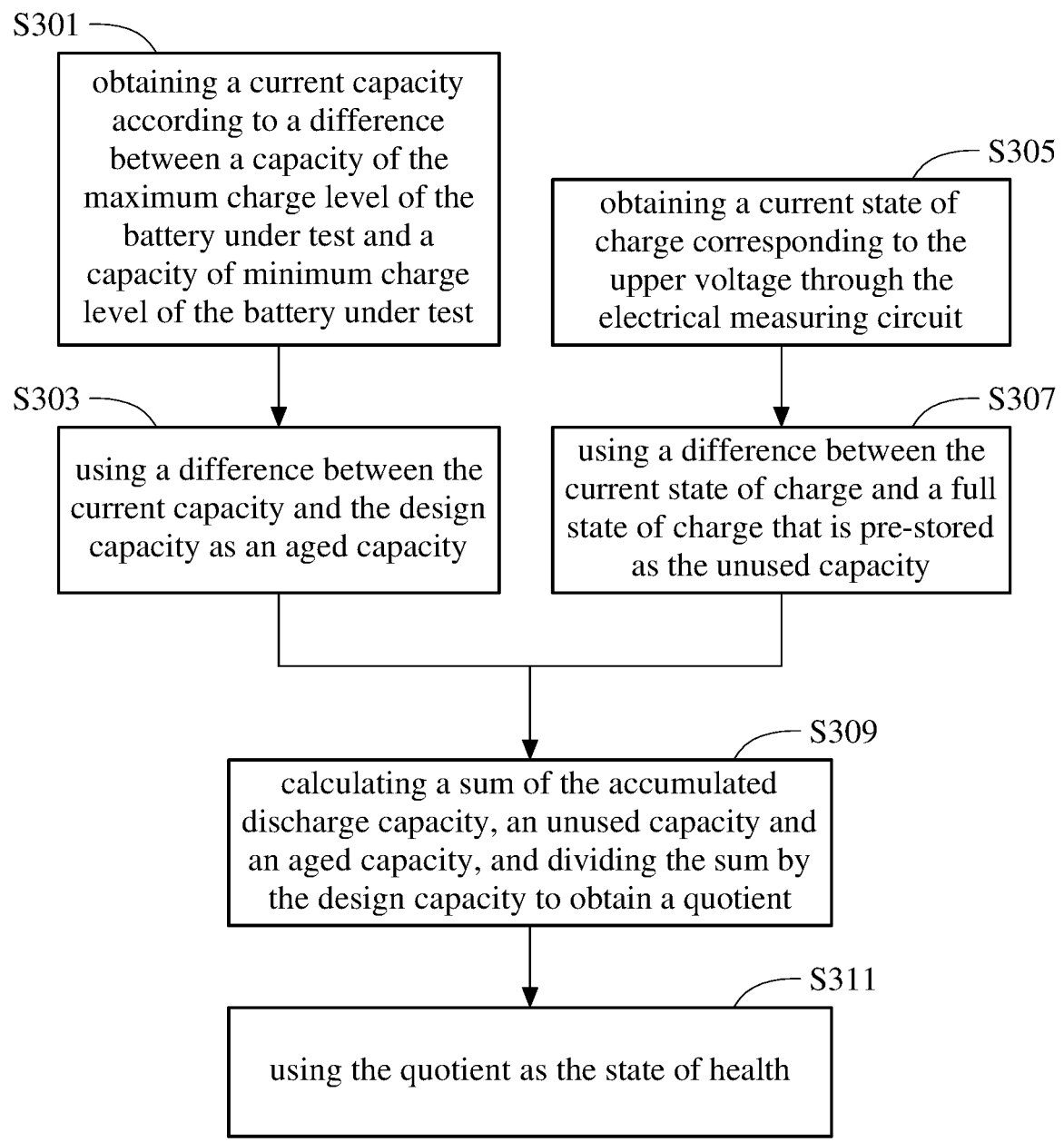
FIG. 3 is a detail flowchart of step S207 of FIG. 2.

Please refer to FIG. 1 and FIG. 3, wherein FIG. 3 is a detail flowchart of step S207 of FIG. 2. As shown in FIG. 3, step S207 of FIG. 2 may include: step S301: obtaining a current capacity according to a difference between a capacity of the maximum charge level of the battery under test and a capacity of minimum charge level of the battery under test; step S303: using a difference between the current capacity and the design capacity as an aged capacity; step S305: obtaining a current state of charge corresponding to the upper voltage through the electrical measuring circuit; step S307: using a difference between the current state of charge and a full state of charge that is pre-stored as the unused capacity; step S309: calculating a sum of the accumulated discharge capacity, an unused capacity and an aged capacity, and dividing the sum by the design capacity to obtain a quotient; and step S311: using the quotient as the state of health. Steps S301 and S303 may be performed before or after steps S305 and S307, steps S301 and S303 may also be performed in parallel with steps S305 and S307 (i.e. performed at the same time), the present disclosure does not limit the sequence of performing steps S301, S303, S305 and S307.

In step S301, the processing control circuit 14 uses the design capacity of the battery under test at 100% charge level as an initial capacity setting (the capacity of the battery under test at the maximum charge level) of the battery under test. The processing control circuit 14 obtains the capacity of the battery under test at the maximum charge level from the electrical measuring circuit 12, obtains the capacity of the battery under test at the minimum charge level, and obtains the current capacity based on the difference between these two capacities. The maximum charge level may indicate that the charge level of the battery under test is 100%, the minimum charge level may indicate that the charge level of the battery under test is 0%. In other words, the processing control circuit 14 may use a capacity of the battery under test that is discharged from 100% of charge level to 0% of charge level as the actual current capacity of the battery under test. It should be noted that, the capacity at the maximum charge level and the capacity at the minimum charge level indicate the capacity of the battery under test at a time point before step S201 of FIG. 2. In other words, the processing control circuit 14 may first obtain the capacity at the maximum charge level and the capacity at the minimum charge level of the battery under test, and store data (numerical values) of these two capacities into the memory 13, and use the difference between the two capacities as the current capacity when calculating the state of health of the battery under test.

In step S303, the processing control circuit 14 uses an absolute value of a difference between the current capacity and the design capacity as the aged capacity. For example, assuming that the design capacity of the battery under test is 30 ampere-hour (Ah), and the current capacity obtained according to step S301 is 27 ampere-hour (Ah), then the aged capacity is 3 ampere-hour (Ah).

In step S305, the processing control circuit 14 obtains the current state of charge corresponding to the battery under test charged to the upper voltage from the electrical measuring circuit 12, wherein the current state of charge may indicate the state of charge when the battery under test is charged to the upper voltage. After using the upper voltage as the condition for offending the charging, SOC may be obtained through the ratio of the current capacity and the design capacity, as the equation below:

$$SOC\ (\%) = \frac{\text{current capacity}}{\text{design capacity}} \times 100$$

In step S307, the processing control circuit 14 uses the difference between the current state of charge and the full state of charge stored by the memory 13 as the unused capacity, wherein the full state of charge may indicate 100% state of charge (SOC). For example, assuming that the current state of charge corresponding to when the battery under test is charged to the upper voltage is 87%, then the unused capacity 13%, meaning 13% of the total capacity of the current battery under test is unused.

In step S309 and step S311, the processing control circuit 14 calculates the state of health through equation (1) below. In other words, the state of health may indicate a ratio of the capacity corresponding to when the battery under test is fully charged and the design capacity of the battery under test.

$$\text{state of health (\%)} = \frac{\text{accumulated discharge capacity} + \text{unused capacity} + \text{aged capacity}}{\text{design capacity}} \quad \text{equation (1)}$$

Figure 4:
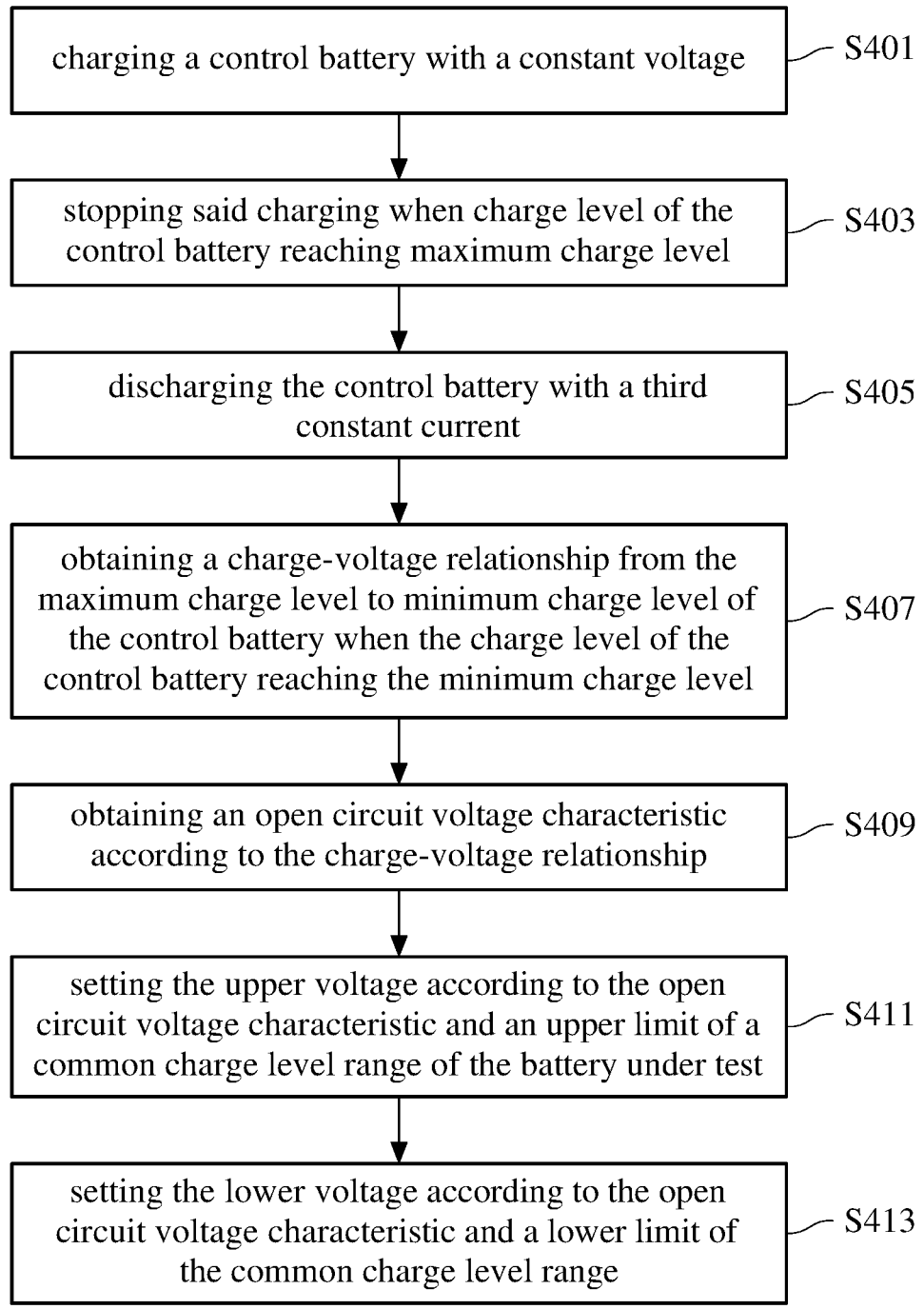
FIG. 4 is a flowchart illustrating a method for calculating state of health of battery according to another embodiment of the present disclosure.
Figure 5:
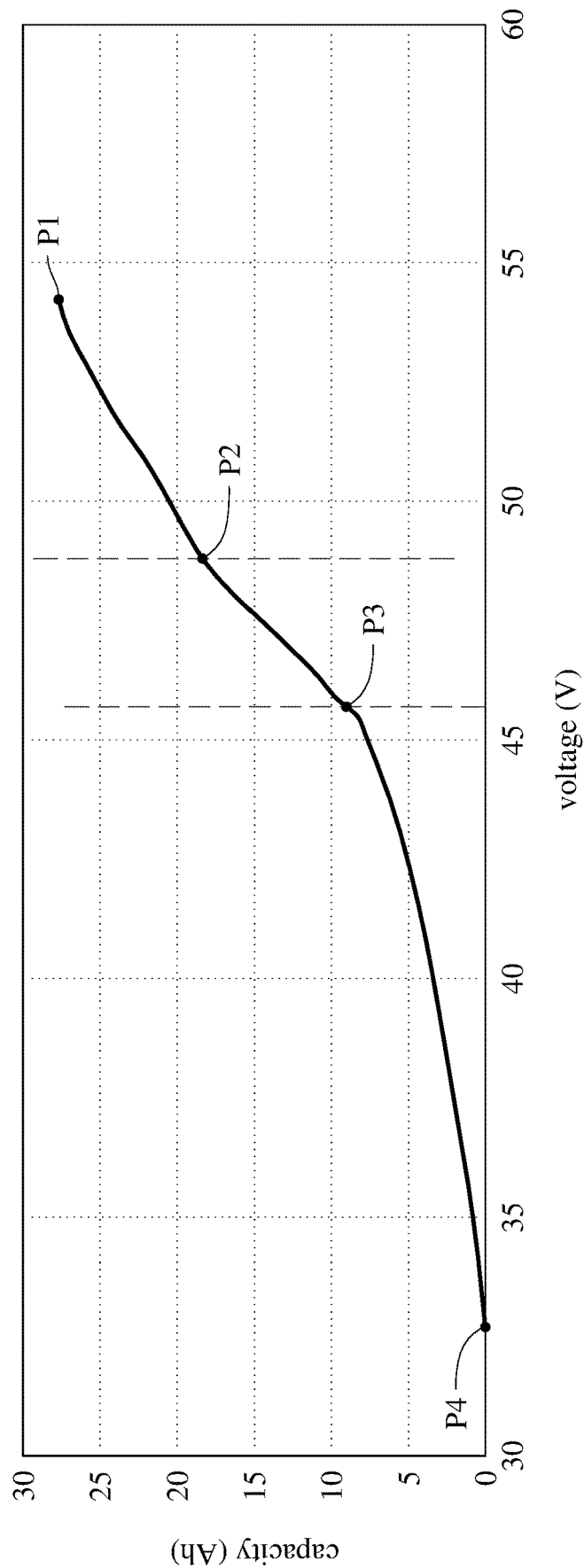
FIG. 5 is a schematic diagram illustrating a method of setting the upper voltage and the lower voltage.

Please refer to FIG. 1, FIG. 4 and FIG. 5, wherein FIG. 4 is a flowchart illustrating a method for calculating state of health of battery according to another embodiment of the present disclosure, FIG. 5 is a schematic diagram illustrating a method of setting the upper voltage and the lower voltage. Steps shown in FIG. 4 are performed before step S201 of FIG. 2. As shown in FIG. 4, before step S201 of FIG. 2, the processing control circuit 14 may further perform: step S401: charging a control battery with a constant voltage; step S403: stopping said charging when charge level of the control battery reaching maximum charge level; step S405: discharging the control battery with a third constant current; step S407: obtaining a charge-voltage relationship from the maximum charge level to minimum charge level of the control battery when the charge level of the control battery reaching the minimum charge level; step S409: obtaining an open circuit voltage characteristic according to the charge-voltage relationship; step S411: setting the upper voltage according to the open circuit voltage characteristic and an upper limit of a common charge level range of the battery under test; and step S413: setting the lower voltage according to the open circuit voltage characteristic and a lower limit of the common charge level range.

It should be noted that, in FIG. 4, step S411 is illustrated to be performed before step S413, but step S411 may also be performed after step S413, or step S411 and step S413 may be performed at the same time, the present disclosure does not limit the sequence of step S411 and S413. In addition, the control battery and the battery under test are of the same battery type.

In step S401, the processing control circuit 14 controls the charging circuit 11 to charge the control battery with the constant voltage, and controls the electrical measuring circuit 12 to continuously measure the charge level of the control battery during charging.

In step S403, when the charge level of the control battery reaches (equal to or greater than) the maximum charge level, the processing control circuit 14 controls the charging circuit 11 to stop charging. The maximum charge level is, for example, SOC of the control battery being at 100%, which may correspond to the first point P1 in FIG. 5.

In step S405, the processing control circuit 14 controls the charging circuit 11 to discharge the control battery with the third constant current, wherein the third constant current is, for example, a current not greater than 0.1 C.

In step S407, when the control battery is fully discharged and the charge level reaches (equal to or smaller than) the minimum charge level (for example, corresponding to a fourth point P4 in to FIG. 5), the processing control circuit 14 obtains the charge-voltage relationship of the control battery from the maximum charge level to the minimum charge level. The charge-voltage relationship may indicate a curve of the voltage relative to the charge level (capacity) during the process of the control battery discharged from the maximum charge level to the minimum charge level. Take FIG. 5 for example, the charge-voltage relationship may be a curve from the first point P1 to the fourth point P4.

In step S409, the processing control circuit 14 obtains the open circuit voltage (OCV) characteristics according to the charge-voltage relationship. The open circuit voltage characteristic may be an equation obtained by performing fitting on the curve of the voltage relative to the capacity.

In step S411, the processing control circuit 14 sets the upper voltage according to the open circuit voltage characteristic and the upper limit of the common charge level range; in step S413, the processing control circuit 14 sets the lower voltage according to the open circuit voltage characteristic and the lower limit of the common charge level range. Then, the processing control circuit 14 stores the upper voltage and the lower voltage into the memory 13. Take FIG. 5 for example, assuming that the common charge level range of the battery under test ranges from 60% to 75%, then in the curve from the first point P1 to the fourth point P4, a point at 60% of the curve may be regarded as the lower limit of the common charge level range, and a point at 75% of the curve may be regarded as the upper limit of the common charge level range. The processing control circuit 14 determines the point at 60% of the curve as the third point P3, and determines the point at 75% of the curve as the second point P2. Therefore, the processing control circuit 14 may set the voltage value corresponding to the third point P3 as the lower voltage, and set the voltage value corresponding to the second point P2 as the upper voltage. In addition, as described above, even though in FIG. 5, the third point P3 is used to represent the lower voltage and the second point P2 is used to represent the upper voltage, the lower voltage and the upper voltage preferably are values including +/− errors.

Moreover, the processing control circuit 14 may include a mode determining module and an upper/lower voltage adjustment module implemented by software modules. The mode determining module may be configured to determine the state of the battery. It is a decision maker that is executed in the background and monitors whether the battery is in a charging state, discharging state or idle state at all times. Based on this decision maker, the accumulated capacity may be calculated indirectly. During the idle state, the accumulated capacity does not change; during the charging state, the accumulated capacity increases; and during the discharging state, the accumulated capacity decreases. The processing control circuit 14 may determine which of the three states the battery under test is in according to user setting. The upper/lower voltage adjustment module may adjust the upper voltage and the lower voltage of the battery under test to become more suitable for the battery under test according to the state that the battery under test is in, and may determine the current accumulated capacity of the battery under test according to the determination result of the mode determining module.

Through the above embodiment, the open circuit voltage characteristic may be obtained by performing only one pre-processing, and extensive pre-processing to build a database may not be needed, thereby effectively reducing the complexity and time for pre-processing. Therefore, the subsequent simulations for different usage scenarios of the battery under test, the proper upper voltage and lower voltage may be quickly determined.

The following exemplarily explains the simulation of said usage scenarios of the battery under test, wherein the battery under test and the control battery used in the simulation are the same as that of table 1, and the open circuit voltage characteristic used to set the upper voltage and the lower voltage may be obtained according to the charge-voltage relationship of FIG. 5.

Assuming that the usage scenario of the battery under test is low usage frequency, it means that the usage count of the battery under test (the number of times the battery under test is used) is low, and usually may be fully charged, and an average charge level of the battery under test ranges from 10% to 100%. Therefore, the processing control circuit 14 sets the upper voltage to be around 52.25V and the lower voltage to be around 42.07V according to the common charge level range and the open circuit voltage characteristic. In this simulation, the first constant current and the second constant current both are 25 A. The simulation results of the charging conditions of the battery under test under the low usage frequency are shown in Table 2 below.

TABLE 2

| number of simulation | upper voltage (V) | SOC after charging (%) | lower voltage (V) | accumulated discharge capacity (Ah) | SOC after discharging (%) | state of health (%) | error (%) |
| --- | --- | --- | --- | --- | --- | --- | --- |
| 1 | 52.25 | 100.0 | 42.07 | 21.8 | 22.0 | 95.0 | −0.2 |
| 2 | 52.24 | 100.0 | 42.07 | 22.0 | 20.7 | 95.4 | 0.2 |
| 3 | 52.24 | 100.0 | 42.07 | 21.9 | 20.9 | 95.2 | 0.0 |

Table 2 shows three pieces of state of health obtained by performing three simulations on the battery under test. Based on the error column, as seen from the table, the error between the actual state of health and the state of health obtained according to one or more embodiments of the present disclosure is not greater than 0.2%. Therefore, table 2 shows when the usage scenario of the battery under test is of low frequency, accurate calculation result of the state of health may be obtained by fully charging the battery under test (SOC being 100%).

Assuming that the usage scenario of the battery under test is medium usage frequency, it means that the battery under test has a normal usage count, but might be unable to be maintained in fully charged state, and an average charge level of the battery under test ranges from 20% to 95%. Therefore, the processing control circuit 14 sets the upper voltage to be around 53V and the lower voltage to be around 42.48V according to the common charge level range and the open circuit voltage characteristic. In this simulation, the first constant current and the second constant current both are 25 A. The simulation results of the charging conditions of the battery under test under medium usage frequency are shown in table 3 below.

TABLE 3

| number of simulation | upper voltage (V) | SOC after charging (%) | lower voltage (V) | accumulated discharge capacity (Ah) | SOC after discharging (%) | state of health (%) | error (%) |
| --- | --- | --- | --- | --- | --- | --- | --- |
| 1 | 53.08 | 87.8 | 44.48 | 16.1 | 31.9 | 94.0 | −1.2 |
| 2 | 53.10 | 92.5 | 44.48 | 16.2 | 29.8 | 94.1 | −1.1 |
| 3 | 53.05 | 93.8 | 44.48 | 16.0 | 30.5 | 93.9 | −1.3 |

Table 3 shows three pieces of state of health obtained by performing three simulations on the battery under test. Based on the error column, as seen from the table, the error between the actual state of health and the state of health obtained according to one or more embodiments of the present disclosure is not greater than 1.3%. Comparing to the common charge level range of the low usage frequency described above, the common charge level range of medium usage frequency is 20% narrower, and the error of the obtained state of health is still not greater than 1.3%. Therefore, table 3 shows that the method and device for calculating state of health of battery according to one or more embodiments of the present disclosure may provide flexible upper voltage and lower voltage to be adapted to different usage scenario of the battery.

Assuming that the usage scenario of the battery under test is high usage frequency, it means that the battery under test is frequently used with shorter charging time, and an average charge level of the battery under test ranges from 30% to 80%. Therefore, the processing control circuit 14 sets the upper voltage to be around 52V and the lower voltage to be around 45.91V according to the common charge level range and the open circuit voltage characteristic. In this simulation, the first constant current and the second constant current both are 25 A. The simulation results of the charging conditions of the battery under test under high usage frequency are shown in table 4 below.

TABLE 4

| number of simulation | upper voltage (V) | SOC after charging (%) | lower voltage (V) | accumulated discharge capacity (Ah) | SOC after discharging (%) | state of health (%) | error (%) |
|---|---|---|---|---|---|---|---|
| 1 | 52.13 | 82.3 | 45.91 | 11.0 | 47.1 | 92.1 | −2.9 |
| 2 | 52.11 | 89.8 | 45.91 | 11.2 | 45.9 | 92.4 | −2.8 |
| 3 | 52.05 | 88.1 | 45.91 | 11.3 | 45.1 | 92.2 | −3.0 |

Table 4 shows three pieces of state of health obtained by performing three simulations on the battery under test. Based on the error column, as seen from the table, the error between the actual state of health and the state of health obtained according to one or more embodiments of the present disclosure is not greater than 3.0%. Comparing to the common charge level range of the low usage frequency described above, the common charge level range of high usage frequency is 40% narrower, and the error of the obtained state of health is still not greater than 3.0%. Therefore, table 4 shows that the method and device for calculating state of health of battery according to one or more embodiments of the present disclosure may provide flexible upper voltage and lower voltage.

Assuming that the usage scenario of the battery under test is medium usage frequency and the battery under test often carries different charging currents, and that average state of charge of the battery under test ranges from 20% to 95%. Therefore, the processing control circuit 14 sets the upper voltage to be around 53V and the lower voltage to be around 42.48V according to the common charge level range and the open circuit voltage characteristic. The simulation results of the battery under test under medium usage frequency and often carrying different charging currents are shown in table 5 below.

TABLE 5

| charging current (A) | upper voltage (V) | SOC after charging (%) | lower voltage (V) | accumulated discharge capacity (Ah) | SOC after discharging (%) | state of health (%) | error (%) |
|---|---|---|---|---|---|---|---|
| 25 | 53.01 | 87.9 | 44.48 | 15.9 | 32.8 | 94.1 | −1.1 |
| 15 | 53.01 | 90.3 | 44.48 | 16.8 | 32.3 | 94.5 | −0.7 |
| 5 | 53.03 | 91.8 | 44.48 | 17.5 | 29.4 | 95.6 | 0.4 |

Table 5 shows three pieces of state of health obtained by performing three simulations with three different charging currents on the battery under test. Based on the error column, as seen from the table, the error between the actual state of health and the state of health obtained according to one or more embodiments of the present disclosure is not greater than 1.1%, wherein the lower the charging current is, the lower the corresponding error is. Therefore, table 5 shows that the method and device for calculating state of health of battery according to one or more embodiments of the present disclosure may be applied to batteries with light loads (low power) and heavy loads (high power), and accurate state of health may be obtained. Therefore, users may make a trade-off between the error of the state of health and charging current according to the usage requirements.

The above embodiments are described by using lithium battery core module as an example, but the method and device for calculating state of health of battery according to one or more embodiments of the present disclosure may also be applied to any existing types of batteries, such as lithium iron phosphate batteries, ternary lithium batteries, etc.

In view of the above description, the method and device for calculating state of health of battery according to one or more embodiments of the present disclosure, charging and discharging cycles required for evaluating the state of health of the battery may be reduced, thereby lowering the complexity and time required for evaluating the state of health of the battery. In addition, the same open circuit voltage characteristic may be applied to the same type of battery module, and the upper voltage and the lower voltage may be arbitrarily set according to the common charge level range of the battery, thereby maximizing the accuracy of the state of health and update frequency. The method and device for calculating state of health of battery according to one or more embodiments of the present disclosure may be applied to a decommissioned battery to efficiently deploy the decommissioned battery onto energy storage system, such as a reconfigurable array of inexpensive batteries architecture (RAIBA). Further, by first charging the battery under test to the default initial voltage before discharging the battery under test according to the usage scenario of the battery under test, the error or the state of health may be reduced.

What is claimed is:

1. A method for calculating state of health of battery, performed by a processing control circuit, comprising:
   charging a battery under test to an upper voltage with a first constant current through a charging circuit and an electrical measuring circuit;
   discharging the battery under test to a lower voltage with a second constant current through the charging circuit and the electrical measuring circuit;
   obtaining an accumulated discharge capacity from the upper voltage to the lower voltage through the electrical measuring circuit; and calculating a state of health of the battery under test at least according to the accumulated discharge capacity and a design capacity, wherein calculating the state of health of the battery under test at least according to the accumulated discharge capacity and the design capacity comprises:

calculating a sum of the accumulated discharge capacity, an unused capacity and an aged capacity, and dividing the sum by the design capacity to obtain a quotient, wherein the unused capacity is a difference between a current state of charge and a full state of charge that is pre-stored by a memory connected to the processing control circuit, and the aged capacity is a difference between a current capacity and the design capacity; and using the quotient as the state of health.

2. The method for calculating state of health of battery according to claim 1, wherein the upper voltage and the lower voltage correspond to a common charge level range of the battery under test.

3. The method for calculating state of health of battery according to claim 1, wherein before charging the battery under test to the upper voltage with the first constant current through the charging circuit and the electrical measuring circuit, the method further comprises:

charging a control battery with a constant voltage;

stopping said charging when charge level of the control battery reaching maximum charge level;

discharging the control battery with a third constant current;

obtaining a charge-voltage relationship from the maximum charge level to minimum charge level of the control battery when the charge level of the control battery reaching the minimum charge level;

obtaining an open circuit voltage characteristic according to the charge-voltage relationship;

setting the upper voltage according to the open circuit voltage characteristic and an upper limit of a common charge level range of the battery under test; and setting the lower voltage according to the open circuit voltage characteristic and a lower limit of the common charge level range.

4. The method for calculating state of health of battery according to claim 1, wherein calculating the state of health of the battery under test at least according to the accumulated discharge capacity and the design capacity further comprises:

obtaining the current state of charge corresponding to the upper voltage through the electrical measuring circuit.

5. The method for calculating state of health of battery according to claim 1, wherein before charging the battery under test to the upper voltage with the first constant current through the charging circuit and the electrical measuring circuit, the method further comprises:

charging the battery under test to a default initial voltage.

6. A device for calculating state of health of battery, comprising:

a charging circuit;

an electrical measuring circuit;

a memory configured to store an upper voltage, a lower voltage, a design capacity and a full state of charge of a battery under test; and a processing control circuit connected to the charging circuit, the electrical measuring circuit and the memory, and configured to perform:

charging the battery under test to the upper voltage with a first constant current through the charging circuit and the electrical measuring circuit;

discharging the battery under test to the lower voltage with a second constant current through the charging circuit and the electrical measuring circuit;

obtaining an accumulated discharge capacity from the upper voltage to the lower voltage through the electrical measuring circuit; and calculating a state of health of the battery under test at least according to the accumulated discharge capacity and the design capacity, wherein calculating the state of health of the battery under test at least according to the accumulated discharge capacity and the design capacity comprises:

calculating a sum of the accumulated discharge capacity, an unused capacity and an aged capacity, and dividing the sum by the design capacity to obtain a quotient, wherein the unused capacity is a difference between a current state of charge and the full state of charge, and the aged capacity is a difference between a current capacity and the design capacity; and using the quotient as the state of health.

7. The device for calculating state of health of battery according to claim 6, wherein the upper voltage and the lower voltage correspond to a common charge level range of the battery under test.

8. The device for calculating state of health of battery according to claim 6, wherein the processing control circuit is further configured to perform:

controlling the charging circuit to charge a control battery with a constant voltage;

stopping said charging when charge level of the control battery reaching maximum charge level;

discharging the control battery with a third constant current;

obtaining a charge-voltage relationship from the maximum charge level to minimum charge level of the control battery when the charge level of the control battery reaching the minimum charge level;

obtaining an open circuit voltage characteristic according to the charge-voltage relationship;

setting the upper voltage according to the open circuit voltage characteristic and an upper limit of a common charge level range of the battery under test; and setting the lower voltage according to the open circuit voltage characteristic and a lower limit of the common charge level range.

9. The device for calculating state of health of battery according to claim 6, wherein the processing control circuit is further configured to obtain the current state of charge corresponding to the upper voltage through the electrical measuring circuit.

10. The device for calculating state of health of battery according to claim 6, wherein the processing control circuit is further configured to control the charging circuit to charge the battery under test to a default initial voltage before charging the battery under test to the upper voltage with the first constant current through the charging circuit and the electrical measuring circuit.

11. The device for calculating state of health of battery according to claim 6, wherein the electrical measuring circuit comprises a voltage sensor configured to detect the upper voltage and the lower voltage of the battery under test.

12. The device for calculating state of health of battery according to claim 6, wherein the electrical measuring circuit comprises an analog coulombic integrator configured to detect the accumulated discharge capacity of the battery under test.

\* \* \* \* \*